United States Patent
Jung et al.

(10) Patent No.: US 9,959,912 B2
(45) Date of Patent: May 1, 2018

(54) TIMED SENSE AMPLIFIER CIRCUITS AND METHODS IN A SEMICONDUCTOR MEMORY

(71) Applicant: QUALCOMM Incorporated, San Diego, CA (US)

(72) Inventors: Chulmin Jung, San Diego, CA (US); Fahad Ahmed, San Diego, CA (US); Sei Seung Yoon, San Diego, CA (US); Keejong Kim, Phoenix, AZ (US)

(73) Assignee: QUALCOMM Incorporated, San Diego, CA (US)

( * ) Notice: Subject to any disclaimer, the term of this patent is extended or adjusted under 35 U.S.C. 154(b) by 0 days. days.

(21) Appl. No.: 15/013,897

(22) Filed: Feb. 2, 2016

(65) Prior Publication Data

US 2017/0221551 A1 Aug. 3, 2017

(51) Int. Cl.
*G11C 7/02* (2006.01)
*G11C 7/00* (2006.01)
(Continued)

(52) U.S. Cl.
CPC .................. *G11C 7/02* (2013.01); *G11C 7/00* (2013.01); *G11C 7/08* (2013.01); *G11C 7/14* (2013.01);
(Continued)

(58) Field of Classification Search
CPC ........... G11C 7/08; G11C 7/14; G11C 11/419; G11C 11/418; G11C 7/02; G11C 29/02; G11C 7/00; G11C 7/10; G11C 5/06
See application file for complete search history.

(56) References Cited

U.S. PATENT DOCUMENTS 5,875,135 A * 2/1999 Patwardhan ........... G11C 29/02
365/194
6,449,200 B1 9/2002 Nelson et al.
(Continued)

FOREIGN PATENT DOCUMENTS

JP 2001357670 A 12/2001
JP 2003123470 A 4/2003
(Continued)

OTHER PUBLICATIONS

Partial International Search Report and Written Opinion—PCT/US2017/012756—ISA/EPO—dated Apr. 4, 2017.
(Continued)

*Primary Examiner* — Ajay Ojha
(74) *Attorney, Agent, or Firm* — Arent Fox, LLP

(57) ABSTRACT

A memory includes a memory cell, one bitline coupled to the memory cell, a sense amplifier coupled to the one bitline, a timing circuit configured to enable the sense amplifier during a read operation, a control circuit configured to enable the sense amplifier independent of the timing circuit, and a pull-up circuit configured to pull up the one bitline while the sense amplifier is enabled by the control circuit. The method includes enabling a sense amplifier in a read operation by a timing circuit. The sense amplifier is coupled to at least one bitline, and the at least one bitline is coupled to a memory cell. The method further includes enabling the sense amplifier independent of the timing circuit in a second operation and pulling up the at least one bitline by a pull-up circuit while the sense amplifier is enabled in the second operation.

30 Claims, 13 Drawing Sheets

(51) Int. Cl.
*G11C 7/08* (2006.01)
*G11C 7/14* (2006.01)
*G11C 11/418* (2006.01)
*G11C 11/419* (2006.01)
*G11C 29/02* (2006.01)
*G11C 29/14* (2006.01)
*G11C 29/50* (2006.01)
*G11C 5/06* (2006.01)
*G11C 7/06* (2006.01)
*G11C 7/10* (2006.01)

(52) U.S. Cl.
CPC .......... *G11C 11/418* (2013.01); *G11C 11/419* (2013.01); *G11C 29/02* (2013.01); *G11C 29/14* (2013.01); *G11C 29/50012* (2013.01); *G11C 5/06* (2013.01); *G11C 7/062* (2013.01); *G11C 7/10* (2013.01); *G11C 29/026* (2013.01)

(56) References Cited

U.S. PATENT DOCUMENTS

| | | | |
|---|---|---|---|
| 6,462,998 B1* | 10/2002 | Proebsting | G11C 7/04 257/E21.659 |
| 7,200,057 B2 | 4/2007 | Pineda et al. | |
| 7,463,508 B2 | 12/2008 | Pineda et al. | |
| 8,270,239 B2 | 9/2012 | Chen et al. | |
| 8,984,353 B2 | 3/2015 | Takeuchi | |
| 9,286,955 B1* | 3/2016 | Stephens, Jr. | G11C 7/08 |
| 2002/0034114 A1 | 3/2002 | Tobita | |
| 2002/0191479 A1* | 12/2002 | Yamauchi | G11C 7/1051 365/233.12 |
| 2003/0156487 A1 | 8/2003 | Izutsu et al. | |
| 2006/0158935 A1* | 7/2006 | Chan | G11C 7/062 365/185.17 |
| 2008/0056040 A1 | 3/2008 | Im et al. | |
| 2008/0101143 A1* | 5/2008 | Jung | G11C 7/08 365/210.1 |
| 2008/0159028 A1 | 7/2008 | Choi | |
| 2009/0103379 A1 | 4/2009 | Zhang et al. | |
| 2010/0265778 A1* | 10/2010 | Yasuda | G11C 7/08 365/194 |
| 2011/0141836 A1 | 6/2011 | Luthra et al. | |
| 2011/0255353 A1 | 10/2011 | Fukushima et al. | |
| 2012/0224405 A1* | 9/2012 | Tanaka | G11C 8/08 365/72 |
| 2013/0058172 A1* | 3/2013 | Rao | G11C 29/026 365/189.05 |
| 2013/0080694 A1 | 3/2013 | Iyer et al. | |
| 2014/0126312 A1 | 5/2014 | Hess et al. | |
| 2015/0016183 A1* | 1/2015 | Sinangil | G11C 7/065 365/156 |

FOREIGN PATENT DOCUMENTS

| | | |
|---|---|---|
| JP | 2006107245 A | 4/2006 |
| JP | 2007115395 A | 5/2007 |
| JP | 2009181666 A | 8/2009 |
| WO | 2013131185 A1 | 9/2013 |

OTHER PUBLICATIONS

International Search Report and Written Opinion—PCT/US2017/012756—ISA/EPO—dated Jul. 21, 2017.

* cited by examiner

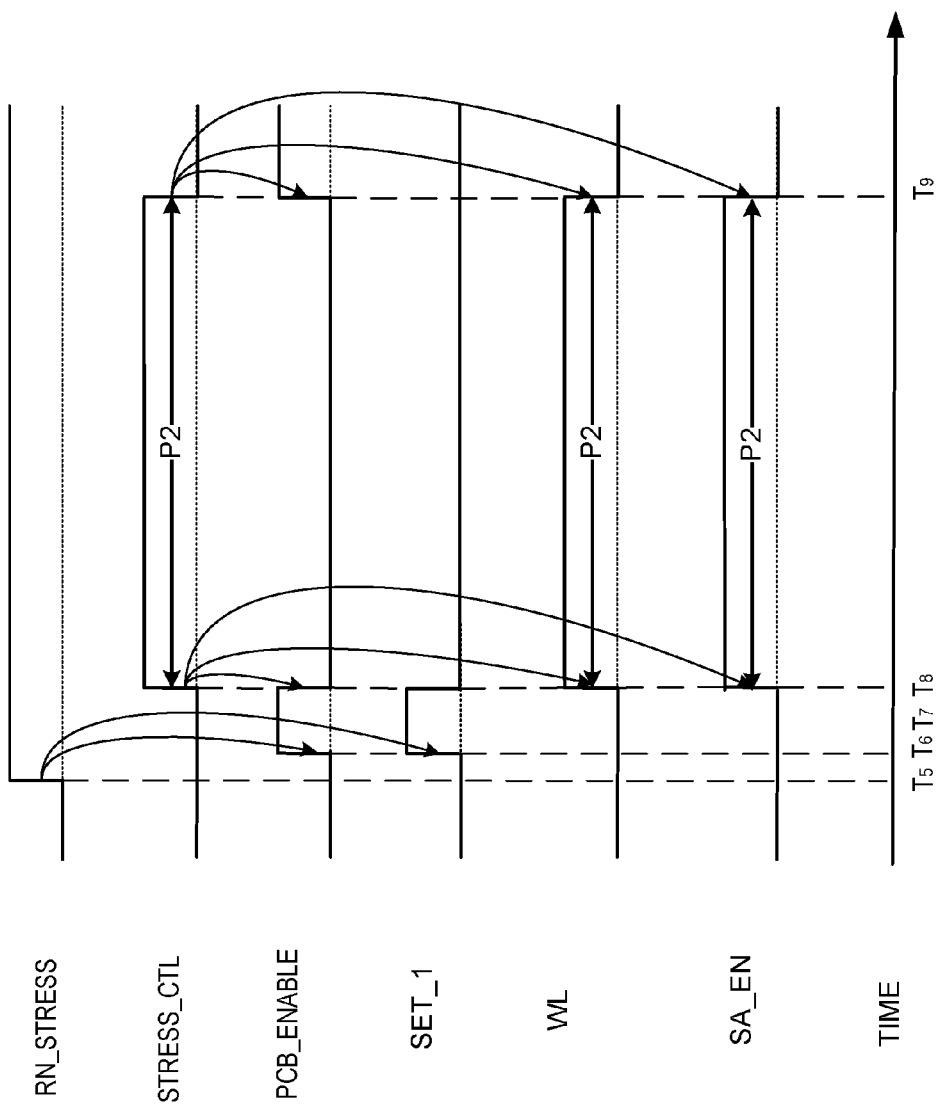

TIMED SENSE AMPLIFIER CIRCUITS AND METHODS IN A SEMICONDUCTOR MEMORY

BACKGROUND

Field

The present disclosure relates generally to memory circuits, and more particularly, to a memory with a random noise stress operation.

Background

Memory is a vital component for wireless communication devices (e.g., integrated as part of an application processor in a cell phone). With the ever increasing demands for more processing capability, the design of wireless communication devices calls for more memories fabricated in smaller dimensions. With the shrinking dimensions, certain issues in memories have become more apparent. Among these issues are increasing failures due to random noise, such as the random telegraph noise.

In some examples, the random telegraph noise may result from sudden and random transitions between two or more discrete voltage levels. As the dimensions of memories shrink, the random telegraph noise may occur more often and the effect more severe. Parts affected or potentially affected by the random noise issue are difficult to screen out during testing of the memories (e.g., testing of the application processors incorporating the memories). In some memories, such random noise may cause the memory cells to flip stored states. As a result, users of the wireless communication devices may experience operation failures in use due to the random telegraph noise issue. Such failures are thus costly both in terms of managing the returns of the expensive wireless communication devices and, perhaps worse, negative consumer experiences.

Minimizing dimensions of integrated circuits (ICs; e.g., memories) carries substantial advantages, particularly in mobile applications. Accordingly, a design challenge is to address the random noise issue.

SUMMARY

Aspects of a memory are disclosed. The memory includes a memory cell, at least one bitline coupled to the memory cell, a sense amplifier coupled to the at least one bitline, a timing circuit configured to enable the sense amplifier during a read operation, a control circuit configured to enable the sense amplifier independent of the timing circuit, and a pull-up circuit configured to pull up the at least one bitline while the sense amplifier is enabled by the control circuit.

Aspects of a method to operate a memory are disclosed. The method includes enabling a sense amplifier in a read operation by a timing circuit. The sense amplifier is coupled to at least one bitline, and the at least one bitline is coupled to a memory cell. The method further includes enabling the sense amplifier independent of the timing circuit in a second operation and pulling up the at least one bitline by a pull-up circuit while the sense amplifier is enabled in the second operation.

Further aspects of a memory are disclosed. The memory includes a plurality of memory cells, a plurality of wordlines respectively coupled to the plurality of memory cells, at least one bitline coupled to one memory cell of the plurality of memory cells, a sense amplifier coupled to the at least one bitline, a control circuit configured to enable the sense amplifier, and an address decoder configured to assert the plurality of wordlines while the sense amplifier is enabled by the control circuit.

It is understood that other aspects of apparatus and methods will become readily apparent to those skilled in the art from the following detailed description, wherein various aspects of apparatus and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of apparatus and methods will now be presented in the detailed description by way of example, and not by way of limitation, with reference to the accompanying drawings, wherein:

FIG. 13 is a timing diagram of a second operation performed by the SRAM of FIG. 4.

DETAILED DESCRIPTION

Figure 1:
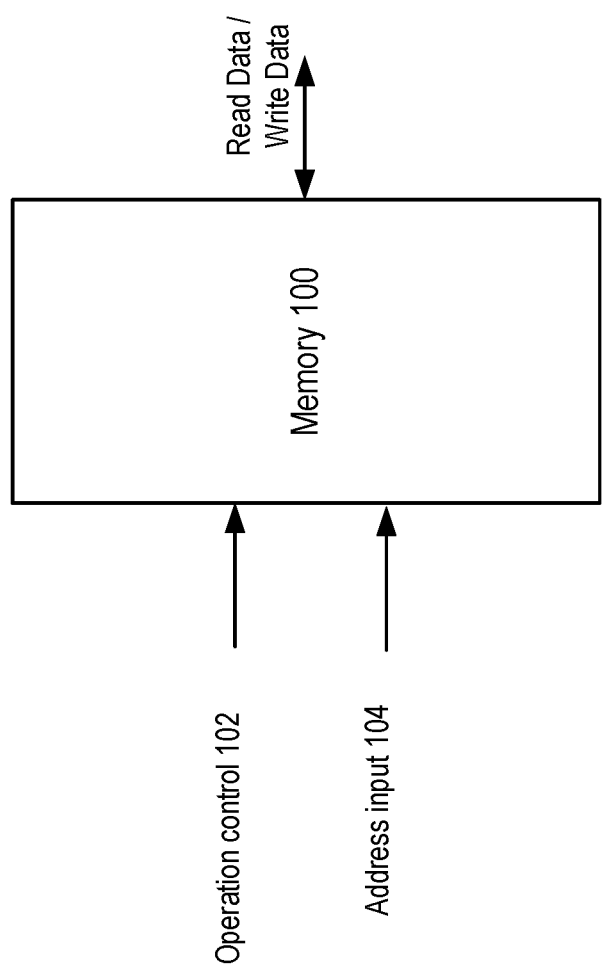
FIG. 1 is a block diagram of an exemplary embodiment of a memory.

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

Various memories and methods for writing to memory presented throughout this disclosure may be incorporated within various apparatuses. By way of example, various aspects of memories disclosed herein may be implemented as or in a stand-alone memory. Such aspects may also be included in any integrated circuit (IC) or system, or any portion of an integrated circuit or system (e.g., modules, components, circuits, or the like residing in an integrated circuit or part of an integrated circuit), or any intermediate product where an integrated circuit or system is combined with other integrated circuits or systems (e.g., a video card, a motherboard, etc.) or any end product (e.g., mobile phone, personal digital assistant (PDA), desktop computer, laptop computer, palm-sized computer, tablet computer, work station, game console, media player, computer based simulators, wireless communication attachments for laptops, or the like). Various aspects of methods disclosed herein shall similarly be implemented in a stand-alone memory or included in any integrated circuit or system, or any portion of an integrated circuit or system, or any intermediate product or end product, or any step, process, algorithm, or the like, or any combination thereof performed by such stand-alone memory, integrated circuit or system (or portion thereof), intermediate product, or end product.

The word "exemplary" is used herein to mean serving as an example, instance, or illustration. Any embodiment described herein as "exemplary" is not necessarily to be construed as preferred or advantageous over other embodiments. Likewise, the term "embodiment" of an apparatus or method does not require that all embodiments of the invention include the described components, structure, features, functionality, processes, advantages, benefits, or modes of operation.

The terms "connected," "coupled," or any variant thereof, mean any connection or coupling, either direct or indirect, between two or more elements, and can encompass the presence of one or more intermediate elements between two elements that are "connected" or "coupled" together. The coupling or connection between the elements can be physical, logical, or a combination thereof. As used herein, two elements can be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Any reference to an element herein using a designation such as "first," "second," and so forth does not generally limit the quantity or order of those elements. Rather, these designations are used herein as a convenient method of distinguishing between two or more elements or instances of an element. Thus, a reference to first and second elements does not mean that only two elements can be employed, or that the first element must precede the second element.

As used herein, the singular forms "a," "an" and "the" are intended to include the plural forms as well, unless the context clearly indicates otherwise. It will be further understood that the terms "comprises," "comprising," "includes" and/or "including," when used herein, specify the presence of the stated features, integers, steps, operations, elements, and/or components, but do not preclude the presence or addition of one or more other features, integers, steps, operations, elements, components, and/or groups thereof.

Various aspects of a memory will now be presented in the context of a static random access memory (SRAM). SRAM is volatile memory that requires power to retain data. However, as those skilled in the art will readily appreciate, such aspects may be extended to other memories and/or circuit configurations. Accordingly, all references to the SRAM are intended only to illustrate exemplary aspects of memory with the understanding that such aspects may be extended to a wide range of applications. In some examples, the described SRAM may be embedded with other IC blocks, such as processors, on a substrate. One such example of embedded SRAM is an application processor for wireless communication applications.

FIG. 1 is a block diagram of an exemplary embodiment of a memory 100. The memory 100 provides a medium for peripheral circuits to write and read data (e.g., program instructions and data operated by the instruction). As used hereinafter, the term "data" will be understood to include program instructions, data, and any other information that may be stored in the memory 100. The memory 100 includes an input for an operation control 102 for controlling an operation of the memory 100. For example, the memory 100 may operate in read, write, or various test modes. The memory 100 also includes inputs for the address (e.g., the address input 104) and for write data to be written to the memory 100 at the specified address. The memory further includes an output for read data read from the memory 100 at the specified address. When writing data to the memory 100, a peripheral circuit sets the operation control 102 to the write mode and sends to the memory 100 the address along with the write data to be written to the memory 100 at that address. When reading data from the memory 100, the peripheral circuit sets the read/write enable control to the read mode and sends the address to the memory 100. In response, the memory 100 sends read data at that address to the peripheral circuit. In some operations, the memory 100 may be set to operate in the various test modes via the operation control 102.

Figure 2:
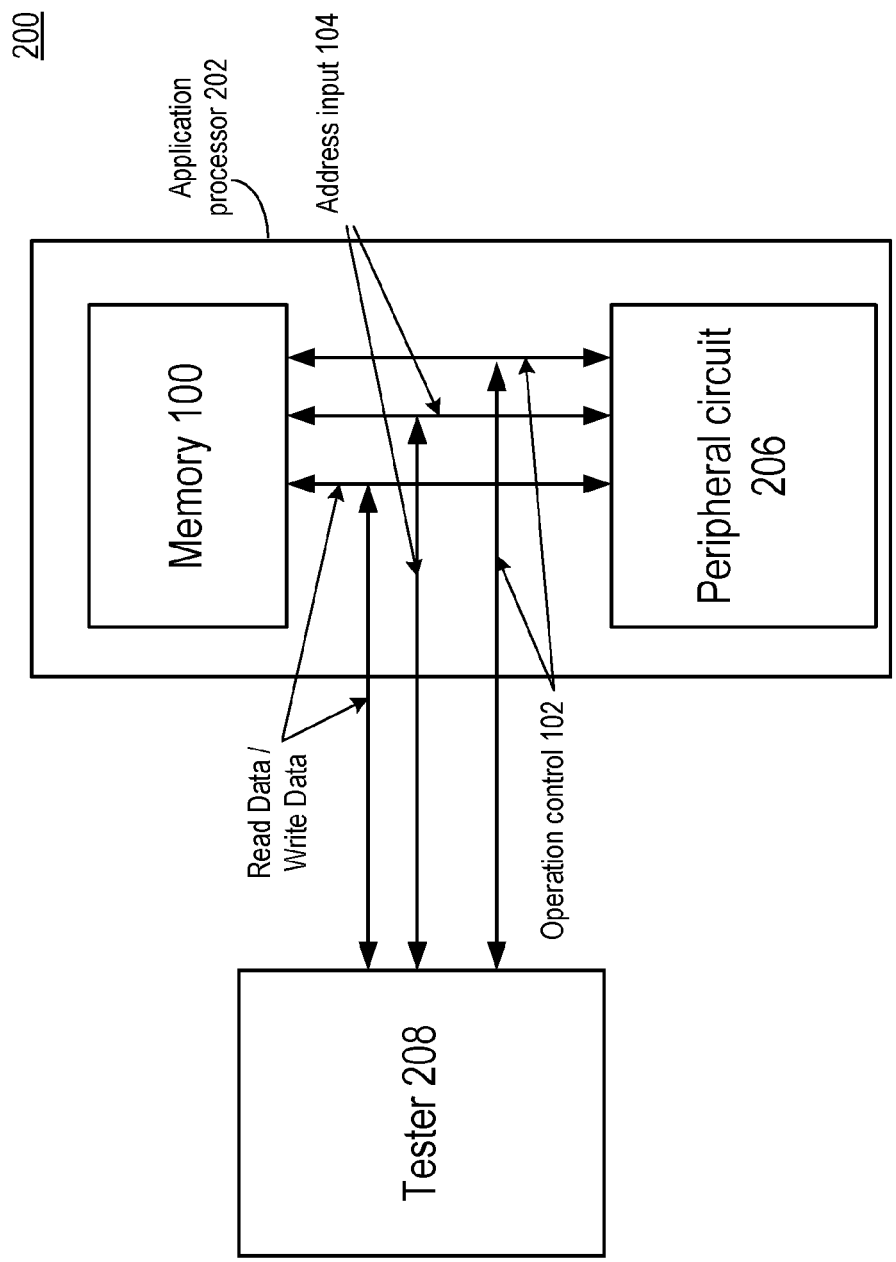
FIG. 2 is a block diagram of an exemplary embodiment of an application processor incorporating the memory of FIG. 1 and a tester.

FIG. 2 is a block diagram 200 of an exemplary embodiment of an application processor incorporating the memory of FIG. 1 and a tester. The application processor 202 is provided as an example having the memory 100 of FIG. 1 incorporated therein. As is known by a person of ordinary skill in the art, applications of the memory 100 are not limited thereto. In some examples, the application processor 202 may be a substrate upon which the memory 100 and various processor cores are incorporated. A processor core may be a collection of circuits and may include an instruction execution unit. One of the processor cores may operate as or include the peripheral circuit 206. In some examples, the peripheral circuit 206 may be construed broadly to include any suitable circuit that is peripheral to the memory 100 and capable of accessing the memory 100. As described with FIG. 1, the peripheral circuit 206 may instruct the memory 100 to execute a read (or write) operation via the operation control 102 and the address input 104. The peripheral circuit 206 may further receive the read data from the memory 100 or provide the write data to the memory 100.

When testing the memory 100 for functionalities and/or various manufacturing defects, such as the aforementioned random noise issue, a tester 208 (e.g., an automatic test equipment) may instruct the memory 100 to perform various test operations via the operation control 102 and the address input 104. The tester 208 may receive the test data from the memory 100 as the read data, and may provide test data to the memory 100 as the write data. Further details in this regard, such as the random noise stress mode, are provided infra.

Figure 3:
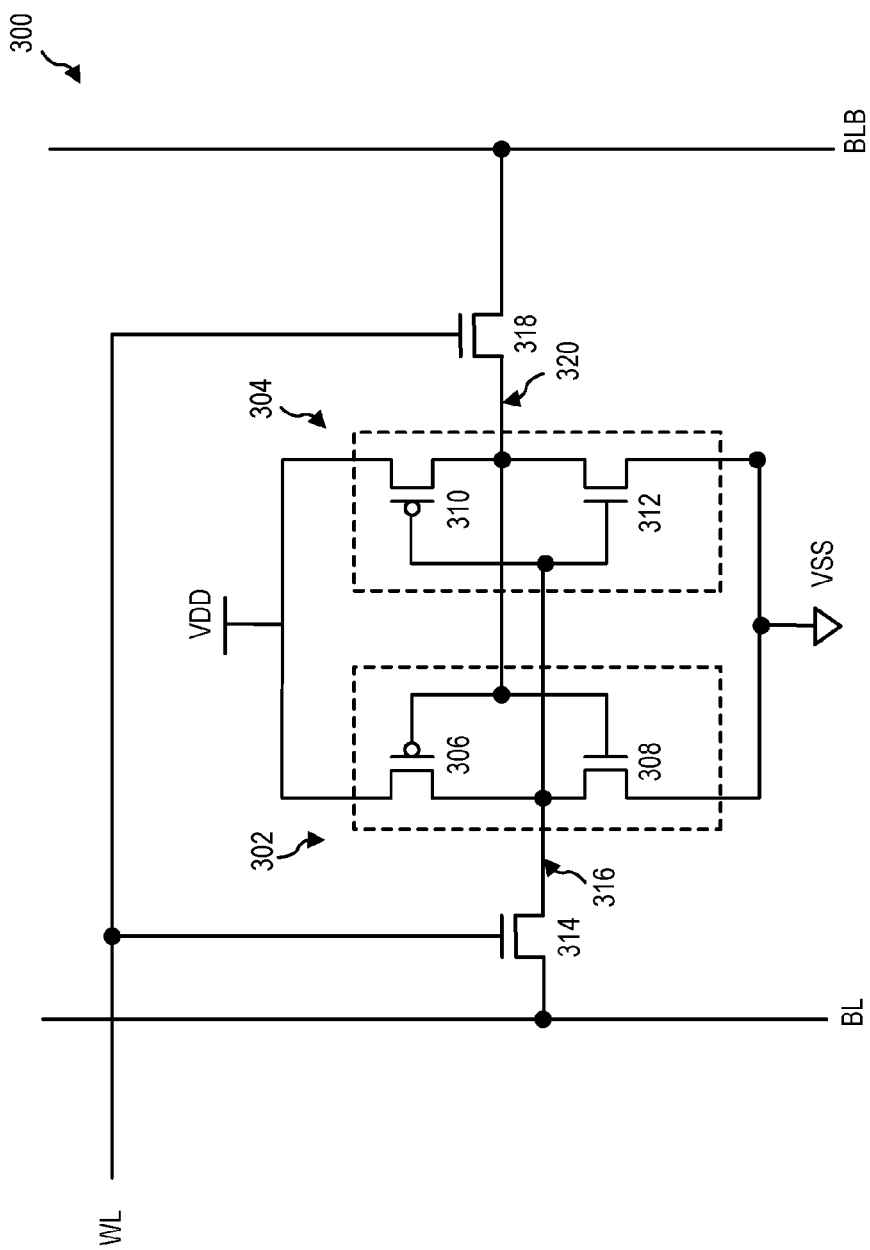
FIG. 3 is a schematic diagram of an exemplary embodiment of a memory cell for an SRAM.

The memory 100 may be any suitable storage medium, such as, by way of example, an SRAM. However, as those skilled in the art will readily appreciate, the memory 100 is not necessarily limited to SRAM. An SRAM includes an array of storage elements know as "cells," "memory cells," or "bitcells." Each memory cell is configured to store one bit of data (e.g., logic 1 or logic 0). FIG. 3 is a schematic diagram of an exemplary embodiment of a memory cell for an SRAM. The memory cell 300 is implemented with a six-transistor (6T) configuration. However, as those skilled in the art will readily appreciate, the cell may be implemented with a four-transistor (4T) or any other suitable transistor configuration.

The memory cell 300 is shown with two inverters 302, 304. The first inverter 302 comprises a p-channel transistor 306 and an n-channel transistor 308. The second inverter 304 comprises a p-channel transistor 310 and an n-channel transistor 312. In the described embodiment, the inverters 302 and 304 are powered by VDD and have a return VSS (e.g., ground). The first and second inverters 302, 304 are interconnected to form a cross-coupled latch. A first n-channel access transistor 314 couples the output node 316 from the first inverter 302 to a bitline BL, and a second n-channel access transistor 318 couples the output node 320 from the second inverter 304 to a bitline BLB (the value of which is the opposite or inverse of the bitline BL). The gates of the access transistors 314, 318 are coupled to a wordline WL.

A read operation may be initiated by precharging or charging the bitlines BL and BLB to a predetermined level, which is determined so as not to disturb the stored data in the memory cell 300. In some examples, the precharge circuit BLPC 412 (see FIG. 4) precharges or pulls up the bitlines BL and BLB to a predetermined level that does not flip the stored data. The predetermined level may be a high level or VDD. In some examples, the predetermined level may be a portion (e.g., half) of VDD. The wordline WL then is asserted, connecting the cross-coupled inverters 302, 304 to the bitlines BL and BLB via the access transistors 314 and 318, respectively. By way of example, the memory cell 300 may store the logic 1 by storing a low level (e.g., ground) at the output node 316 and a high level (e.g., VDD) at the output node 320. These states are maintained by the cross-coupled inverters 302, 304. Upon asserting the wordline WL, the inverter 302 discharges the bitline BL through the access transistor 314 and the output node 316. The bitline BLB is maintained at the high level by the inverter 304 through the access transistor 318 and the output node 320. A voltage difference on the bitline pair BL and BLB is thus established by the pulling-down of the bitline BL.

The bitlines BL and BLB are fed to a sense amplifier (SA), which senses the data (e.g., voltage difference) carried thereon and outputs a logic level (e.g., logic 1) as the read data to the peripheral circuit 206. The SA and the precharge circuit BLPC 412 will be discussed in details infra.

A write operation may be initiated by setting the bitlines BL and BLB to the value to be written to the memory cell 300 and asserting the wordline WL. That is, the write data are driven onto the bitlines BL and BLB. The wordline WL may be asserted before the value to be written (e.g., write data) is provided to the bitlines BL and BLB. By way of example, a logic 1 may be written to the memory cell 300 by setting the bitline BL to a logic level 0 and the bitline BLB to a logic 1. The logic level 0 at the bitline BL is applied to the input of the second inverter 304 through the access transistor 314, which in turn forces the output node 320 of the second inverter 304 to VDD. The output node 320 of the second inverter 304 is applied to the input of the first inverter 302, which in turn forces the output node 316 of the first inverter 302 to VSS. A logic level 0 may be written to the memory cell 300 by inverting the values of the bitlines BL and BLB. The write driver (not shown) is designed to be stronger than the pull-up transistors (306 and 310) in the memory cell 300 so that it can override the previous state of the cross-coupled inverters 302, 304.

Once the read or write operation is complete, the wordline is de-asserted, thereby causing the access transistors 314 and 318 to disconnect the bitlines BL and BLB from the two inverters 302, 304. The cross-coupling between the two inverters 302, 304 maintains the state of the inverter outputs as long as power is applied to the memory cell 300.

Figure 4:
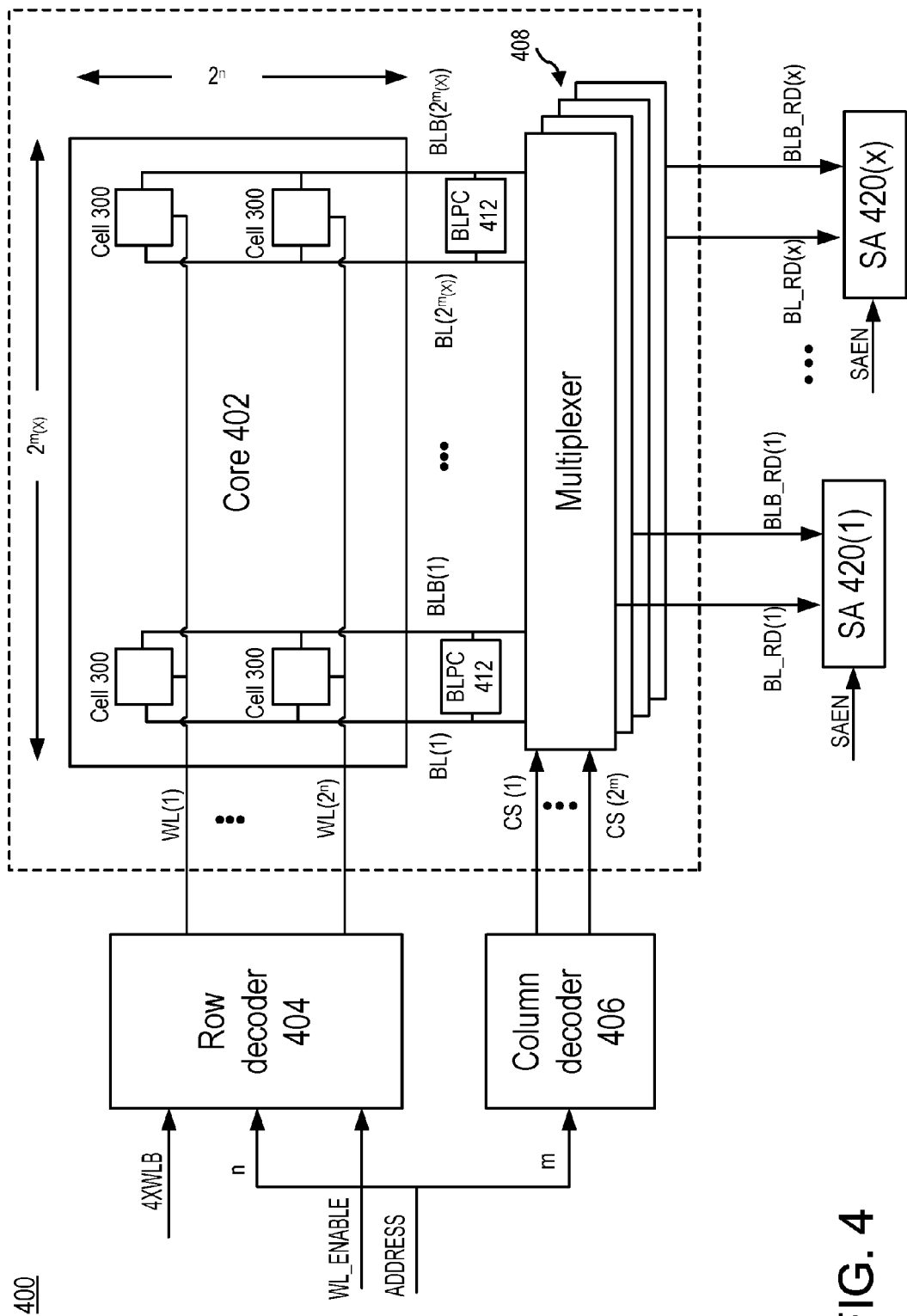
FIG. 4 is a functional block diagram of an exemplary embodiment of an SRAM.

FIG. 4 is a functional block diagram of an exemplary embodiment of an SRAM. Various aspects of an SRAM will now be presented in the context of a read operation. Accordingly, for clarity of presentation, only the connections for the read operation are shown. Those skilled in the art will readily appreciate that additional connections are required to support the write operation.

Moreover, the SRAM 400 may be configured to perform test operations, such as a random noise stress mode. Certain of the memory cells 300 and/or the SAs 420 of the SRAM 400 may be more susceptible to the random noise (e.g., the random telegraph noise) than others. It would be beneficial to screen out those susceptible memory cells 300 and/or the SAs 420 via the random noise stress mode. Further details of the random noise stress mode are presented infra.

The SRAM 400 includes a core 402 with supporting circuitry to decode addresses and perform read and write operations. The core 402 is comprised of memory cells 300 arranged to share connections in horizontal rows and vertical columns. Specifically, each horizontal row of memory cells 300 shares a wordline WL and each vertical column of memory cells 300 shares a pair of bitlines BL and BLB. The size of the core 402 (i.e., the number of cells) may vary depending on a variety of factors including the specific application, the speed requirements, the layout and testing requirements, and the overall design constraints imposed on the system. Typically, the core 402 will contain thousands or millions of memory cells.

In the exemplary embodiment of the SRAM shown in FIG. 4, the core 402 is made up of ($2^n \times 2^m(x)$) memory cells 300 arranged in $2^n$ horizontal rows and $2^m(x)$ vertical columns, where $2^m$ is the number of words per row and x is the number of bits outputted for a read access. A peripheral device (not shown) may randomly access any word (i.e., x cells) in the core 402 using an address that is (n+m) bits wide. In this example, n-bits of the address are provided to the input of a row decoder 404 and m-bits of the address are provided to the input of a column decoder 406. The column decoder 406 provides $2^m$ outputs column selects (CS(1)–CS($2^m$)) with a different one of the outputs asserted for each different combination of address inputs. The outputs are provided to x multiplexers 408. By way of example, the multiplexers 408 may include passgates to perform the multiplexing function. Each multiplexer may be a $2^m$:1 multiplexer and as such may select one of $2^m$ bitline pairs read from the memory core 402 based on the outputs from the column decoder 406. With x multiplexers 408, x bits are selected and outputted for each read access. The selected x bitline pairs are outputted to SAs 420 as bitline pairs BL_RD and BLB_RD.

The row decoder 404 converts the n-bit address into $2^n$ wordline outputs. A different wordline WL is asserted by the row decoder 404 for each different n-bit row address. As a result, each of the $2^m(x)$ memory cells 300 in the horizontal row with the asserted wordline WL is connected to one pair of the $2^m(x)$ bitlines BL and BLB through its access transistors as described above in connection with FIG. 3. The data stored in the memory cells are provided to the BL_RD and BLB_RD bitline pairs through the selected pairs of bitlines BL and BLB and the x multiplexers 408 with the asserted wordline WL, as described with FIG. 3. The BL_RD and BLB_RD bitline pairs are provided to the SAs 420 for amplification, and the resulting data of the amplification are outputted as read data.

In some examples, the row decoder 404 may be enabled or disabled by the signal WL_ENABLE. When the WL_ENABLE signal is de-asserted, the row decoder 404 does not assert any wordline. In this fashion, the WL_ENABLE signal may control a period and timing of asserting a wordline.

In some examples, the tester 208 may instruct the SRAM 400 to perform test operations via the operation control 102. One such test operation may be the random noise stress mode (to be described in further details infra). In some examples, the SRAM 400 may assert multiple wordlines to stress multiple rows of memory cells 300 while the SAs 420 are stressed. The signal 4XWLB controls the row decoder 404 to assert multiple wordlines at once to achieve this function.

Figure 5:
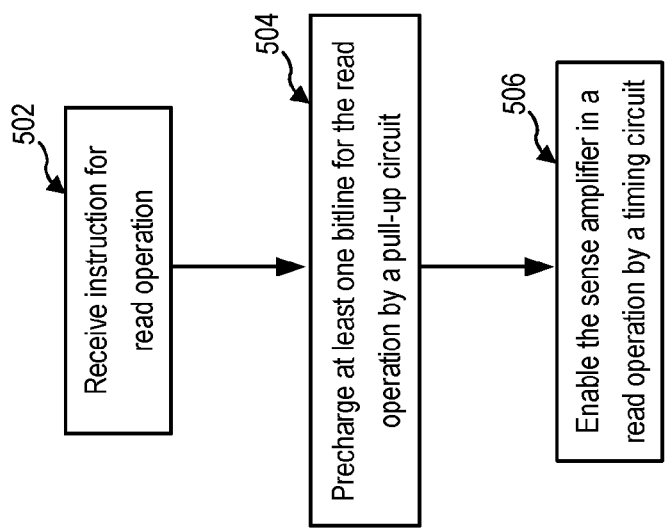
FIG. 5 is the flowchart of the SRAM of FIG. 4 in a read operation.
Figure 6:
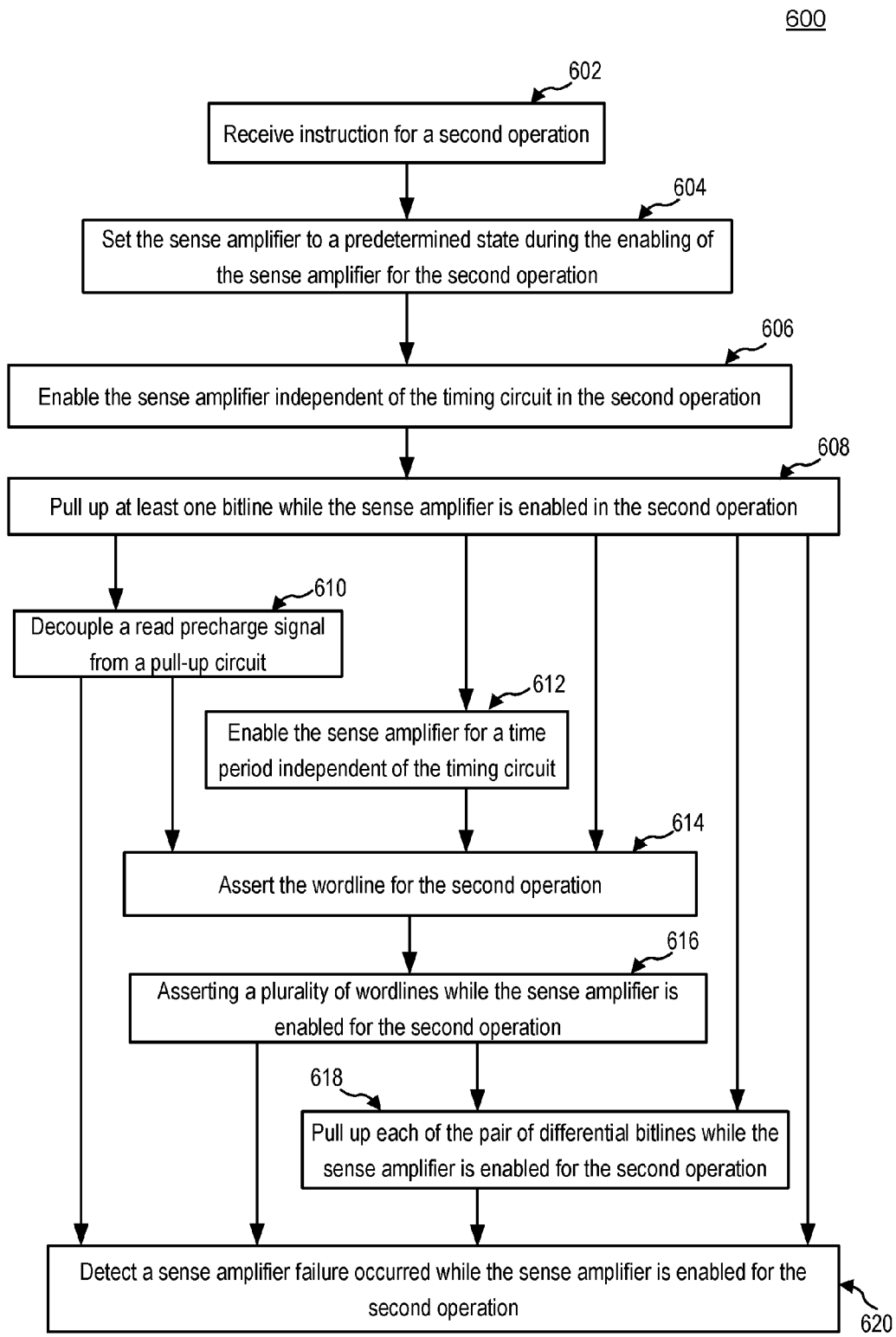
FIG. 6 is the flowchart of the SRAM of FIG. 4 in a second operation.

FIGS. 5 and 6 are flowcharts of operations of the SRAM of FIG. 4. FIG. 5 is the flowchart 500 of the SRAM of FIG. 4 in a read operation. At 502, an instruction for a read operation is received. In some examples, the peripheral circuit 206 may instruct the SRAM 400 to perform the read operation via the operation control 102. Thus, the SRAM 400 may receive the instruction for the read operation from the operation control 102.

At 504, at least one bitline is precharged for the read operation by a pull-up circuit. Referring to FIG. 3, the bitline pair BL_RD and BLB_RD is precharged or pulled up to a predetermined level which does not change the stored state of the memory cell 300. In some examples, such predetermined level may be high level or VDD. Referring to FIG. 4, the BLPC circuit 412 performs the precharge function. The BLPC circuit 412 is discussed in further detail in FIG. 8.

At 506, the sense amplifier is enabled in a read operation by a timing circuit. Referring to FIG. 4, the data stored in the memory cell 300 is placed upon the bitline pair BL_RD and BLB_RD as a differential voltage, and the bitline pair BL_RD and BLB_RD is provided as input to the SA 420. The SA 420 is enabled by the signal SAEN and amplifies the data on the bitline pair BL_RD and BLB_RD. The timing of the signal SAEN in the read operation is controlled so as not to be too early to cause a false read by the SA 420 (e.g., noise on the bitline pair BL_RD and BLB_RD is amplified instead of the actual data). At the same time, the timing of the SAEN signal cannot be so late as to impact the read cycle time of the SRAM 400. The timing circuit is discussed in further detail in FIG. 7.

FIG. 6 is the flowchart 600 of the SRAM of FIG. 4 in a second operation, such as a test operation. In some examples, the second operation may be a non-read operation (thus differs from the read operation), such as a test operation. The second operation may be the SRAM 400 operating in the random noise stress mode. Some of the memory cells 300 and the SAs 420 may be more susceptible to the random noise (e.g., random telegraph noise) than others. To screen out the susceptible SAs 420, for example, the SRAM 400 in the random noise stress mode may stress the SAs 420 by enabling the SAs 420 for an extended time period (e.g., longer than the enabling period for the read operation). The SRAM 400 may then check for the states of the SAs 420 to determine whether the SAs 420 have changed states during the extended enabling period. The longer the extended enabling period, the more likely the susceptible SAs 420 change states. Moreover, in some examples, the SRAM 400 in the random noise stress mode may stress the memory cells 300 at the same extended enabling period by asserting one or more wordlines.

At 602, an instruction for the second operation is received. In some examples, the tester 208 may instruct the SRAM 400 to perform the second operation (e.g., the test operation such as the random noise stress mode) via the operation control 102. Thus, the SRAM 400 may receive the instruction for the test operation from the operation control 102.

At 604, the sense amplifier is set to a predetermined state during the enabling of the sense amplifier for the second operation. In some examples, the SAs 420 may be set to known, predetermined states (e.g., logic 1 or logic 0) for the enabling of SAs 420. A voltage adjustment circuit, described in further detail with FIG. 9, may perform the adjustment in response to entering the random noise stress mode. In such fashion, the control circuit for the random noise stress mode may determine whether a random noise fault occurred during the enabling of the SA 420 (e.g., the SA 420 switches states during the enabling of the SA 420) based on the predetermined state.

At 606, the sense amplifier is enabled independent of the timing circuit in the second operation. In the random noise stress mode, the SRAM 400 stresses at least the SAs 420 by enabling the SAs 420 for an extended time period, bypassing the timing circuit used to enable the SAs 420 in the read operation. In some examples, the extended enabling time period in the second operation may be controlled by the tester 208. This time period impacts the amount or percentage of the susceptible SAs 420 that are screened out by the random noise stress mode. The longer the time period of enabling the SAs 420, the more likely the susceptible SAs 420 may change states and be screened out. The tester 208 may thus determine the time period for stressing the SAs 420 to meet a reliability target. A control circuit of the random noise stress mode configured to enable the SAs 420 in the second operation is presented in FIG. 7.

At 608, at least one bitline is pulled up while the sense amplifier is enabled in the second operation. The bitlines coupled to the enabled SA 420 may be pulled up to further stress the SA 420. In some examples, a pull-up circuit pulls up the bitline pair BL and BLB to a prearranged level during the time period of enabling the SAs 420 in the random noise stress mode. In some examples, the pull-up circuit may include the precharge circuit used to precharge the bitline pair BL and BLB to a predetermined level in the read operation (thus, the prearranged level for the second operation would be the same as the predetermined level for the read operation). An example of such pull-up circuit may be the BLPC circuit 412, and the predetermined level may be high level or VDD.

At 610, a read precharge signal is decoupled from the pull-up circuit. In some examples, the BLPC circuit 412 may be controlled by a read precharge signal to precharge the bitline pair BL and BLB in the read operation. The control signal of the random noise stress mode may facilitate the pulling up of the bitline pair BL and BLB in the random noise stress mode by decoupling the read precharge signal from the precharge circuit (e.g., the pull-up circuit in some examples). Further details on these features are presented with FIG. 8.

At 612, the sense amplifier is enabled for a time period independent of the timing circuit. In some examples, the time period to enable the SAs 420 in the second operation may be controlled by the tester 208 (e.g., controlled by a signal external to the SRAM 400). The tester 208 may assert the external signal for the time period via the operation control 102. In response, the SRAM 400 may enable the SAs 420 for the same time period. Greater details on these features are presented with FIG. 7.

At 614, the wordline is asserted for the second operation. At 616, a plurality of wordlines is asserted while the sense amplifier is enabled for the second operation. In the random noise stress mode, the memory cells 300 may be stressed at the same time as the SAs 420 to reduce test time. In some examples, the row decoder 404 may assert multiple wordlines on a column of memory cells 300 (e.g., sharing the same bitline pair BL and BLB) to further reduce the test time. An example of such row decoder 404 is provided with FIG. 10.

At 618, each of the pair of differential bitlines is pulled up while the sense amplifier is enabled for the second operation. Referring to FIGS. 3 and 4, the memory cell 300 is coupled to the differential bitline pair BL and BLB. In some examples, the precharge circuit (e.g., the BLPC circuit 412) is configured to pull up each of the differential bitline pair BL and BLB while the SA 420 is enabled for the second operation.

At 620, a sense amplifier failure occurred while the sense amplifier is enabled for the second operation is detected. In some examples, the SAs 420 are set to known, predetermined states (e.g., logic 1 or logic 0) during the enabling of SAs 420 (e.g., operation performed at 604). The control circuit for the random noise stress mode may read the read data outputted by the SA 420 and compare the read data to the predetermined state. In such fashion, the control circuit determines whether a random noise fault had occurred during the enabling of the SA 420.

Figure 7:
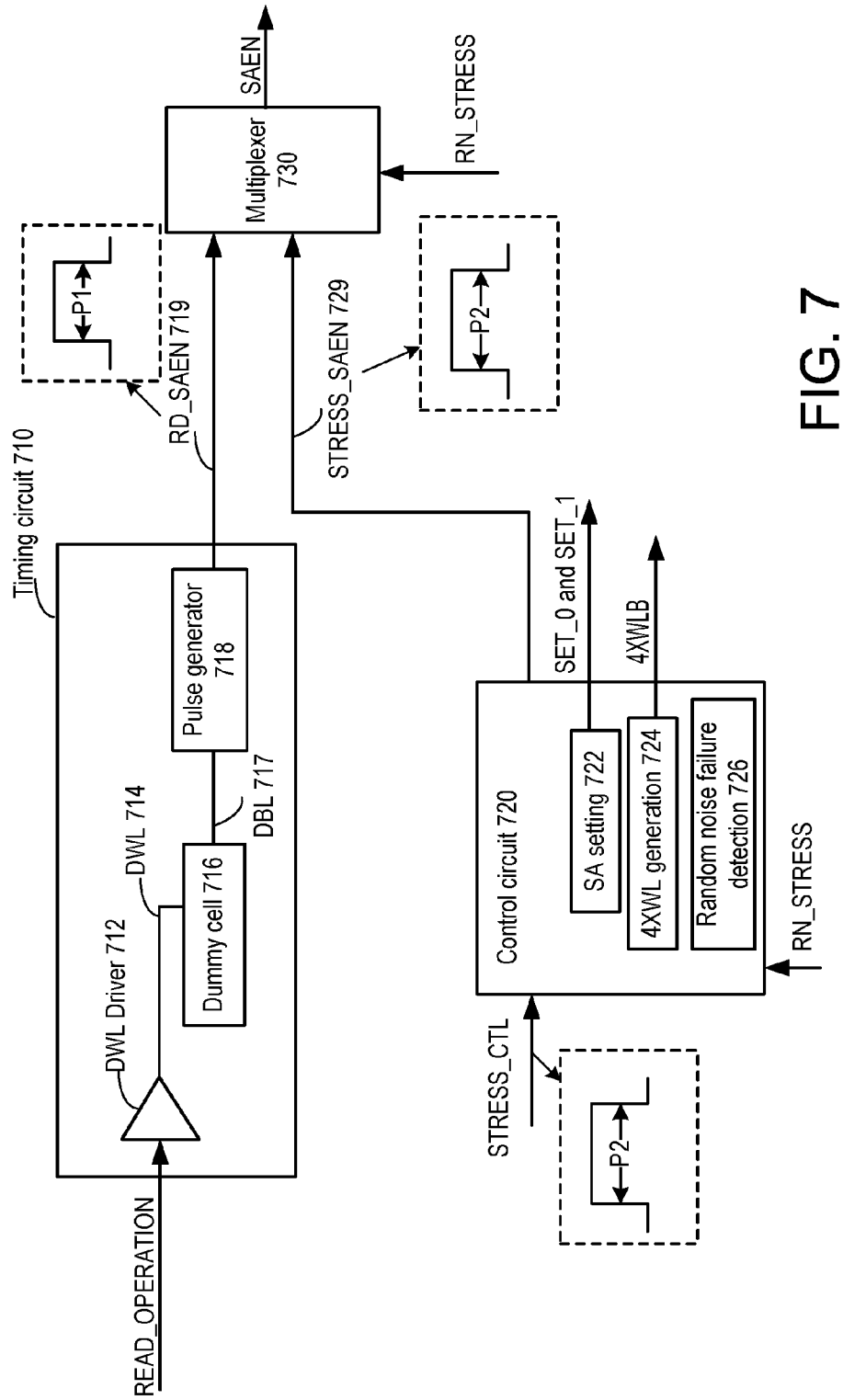
FIG. 7 is a circuit diagram of an exemplary embodiment of circuits to enable the sense amplifier in the second operation.

FIG. 7 is a circuit diagram 700 of an exemplary embodiment of circuits to enable the sense amplifier in the second operation, such as the random noise stress mode. In some examples, the SRAM 400 in the random noise stress mode stresses the SAs 420 by enabling the SAs 420 in a controlled period of time, with both bitlines of the bitline pair BL_RD and BLB_RD (inputs to the SA 420) pulled up to a prearranged level. The circuit diagram 700 illustrates a timing circuit 710 and a control circuit 720, which operates to generate the SA enable signal SAEN. The SAEN signal enables the SA 420.

In a read operation, the peripheral circuit 206 may instruct the SRAM 400 to perform read operation via the operation control 102. The READ_OPERATION signal indicating read operation may be received from or generated based on the operation control 102 for read operation. The timing circuit 710 receives the READ_OPERATION signal indicating read operation and generates the read SA enable signal RD_SAEN 719.

The timing circuit 710 includes a dummy wordline (DWL) driver 712 outputting the DWL signal 714. A dummy cell 716 emulates the memory cell 300 (e.g., by emulating the loading thereof). As is known in the art, the dummy cell 716 need not be an actual memory cell but may include resistors and capacitors to match an electrical characteristic (e.g., RC characteristic) of the memory cell 300. As would be understood by a person or ordinary skill in the art, the matching of electrical characteristic of the memory cell 300 may refer to meeting certain design criteria. For example, such design criteria may be that the RD_SAEN 719 is not asserted too early to cause a false read at the SA 420 or too late to cause a performance issue. The dummy cell 716 receives the DWL signal 714 and outputs the dummy bitline (DBL) signal 717. The pulse generator 718 receives the DBL signal 717 and outputs the read SA enable signal RD_SAEN 719 as a pulse of a fixed time period P1. Thus, in a read operation, the SA 420 is enabled for the fixed time period P1.

The read SA enable signal RD_SAEN 719 is provided to the multiplexer 730 controlled by the RN_STRESS signal (which indicates that the SRAM 400 is in the random noise stress mode). In read operation, the RN_STRESS signal is de-asserted, and the multiplexer 730 selects the read SA enable signal RD_SAEN 719 as the SAEN signal to enable the SA 420.

In a test operation such as the random noise stress mode, the tester 208 may instruct the SRAM 400 to perform the test operation via the operation control 102. The STRESS_CTL signal (indicating the random noise stress mode) may be received from or generated based on the operation control 102 for the random noise stress mode. In some examples, the STRESS_CTL signal corresponds to an external timing signal provided by the tester 208 (e.g., received via the operation control 102). Thus, the tester 208 may control a time period P2 of the STRESS_CTL signal to stress the SAs 420.

The control circuit 720 (e.g., a control circuit for the random noise stress mode) receives the STRESS_CTL signal and is enabled by the RN_STRESS signal (indicating that the SRAM 400 is in the test operation, such as the random noise stress mode). The control circuit 720 may, for example, include a receiver that receives the STRESS_CTL signal from the operation control 102 or drivers that drive the received STRESS_CTL signal. In response, the control circuit 720 generates the sense enable signal for the random noise stress mode or STRESS_SAEN 729. The signal STRESS_SAEN 729 is asserted or turned on for the same time period P2 as the STRESS_CTL signal.

The signal STRESS_SAEN 729 is provided to the multiplexer 730 controlled by the RN_STRESS signal (which indicates that the SRAM 400 is in the random noise stress mode). In the second or test operation (e.g., the random noise stress mode), the RN_STRESS signal is asserted, and the multiplexer 730 selects the signal STRESS_SAEN 729 as the SAEN signal to enable the SA 420. Thus, in the second or test operation, the SAs 420 are enabled for the second time period P2, which may be controlled by the tester 208 via signal external to the SRAM 400.

The control circuit 720 may include various components to operate the SRAM 400 in the random noise stress mode. For example, the control circuit 720 may include the random noise failure detection component 726 that causes the SRAM 400 to compare the read data outputted by the SA 420 and the predetermined state of the SA 420. In such fashion, the control circuit 720 determines whether a random noise fault had occurred during the enabling of the SA 420. The control circuit 720 may further include the SA setting component 722 (described with FIG. 9) and the 4XWL generation component 724 (described with FIG. 10).

In an exemplary embodiment, the control circuit 720 (and the read control block 1102 of FIG. 11) and the components contained therein, presented above, may include circuits, processor or processors, software executing on the processor or processors, or combinations thereof. These components may include circuits for generating the signals for the functions described infra or signal lines carrying those signals.

By way of example, a component, or any portion of a component, or any combination of components may be implemented with one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

As presented above, FIG. 7 illustrates structures to perform operations shown in the flowcharts 500 and 600 (FIGS. 5 and 6). For example, FIG. 7 includes structures to enable the SA 420 in a read operation by a timing circuit (e.g., operation in 506), to enable the SA 420 independent of the timing circuit in the second operation (e.g., operation in 604), to enable the SA 420 independent of the timing circuit in the second operation (e.g., operation in 606), and to enable the SA 420 for a time period independent of the timing circuit (e.g., operation in 612).

Figure 8:
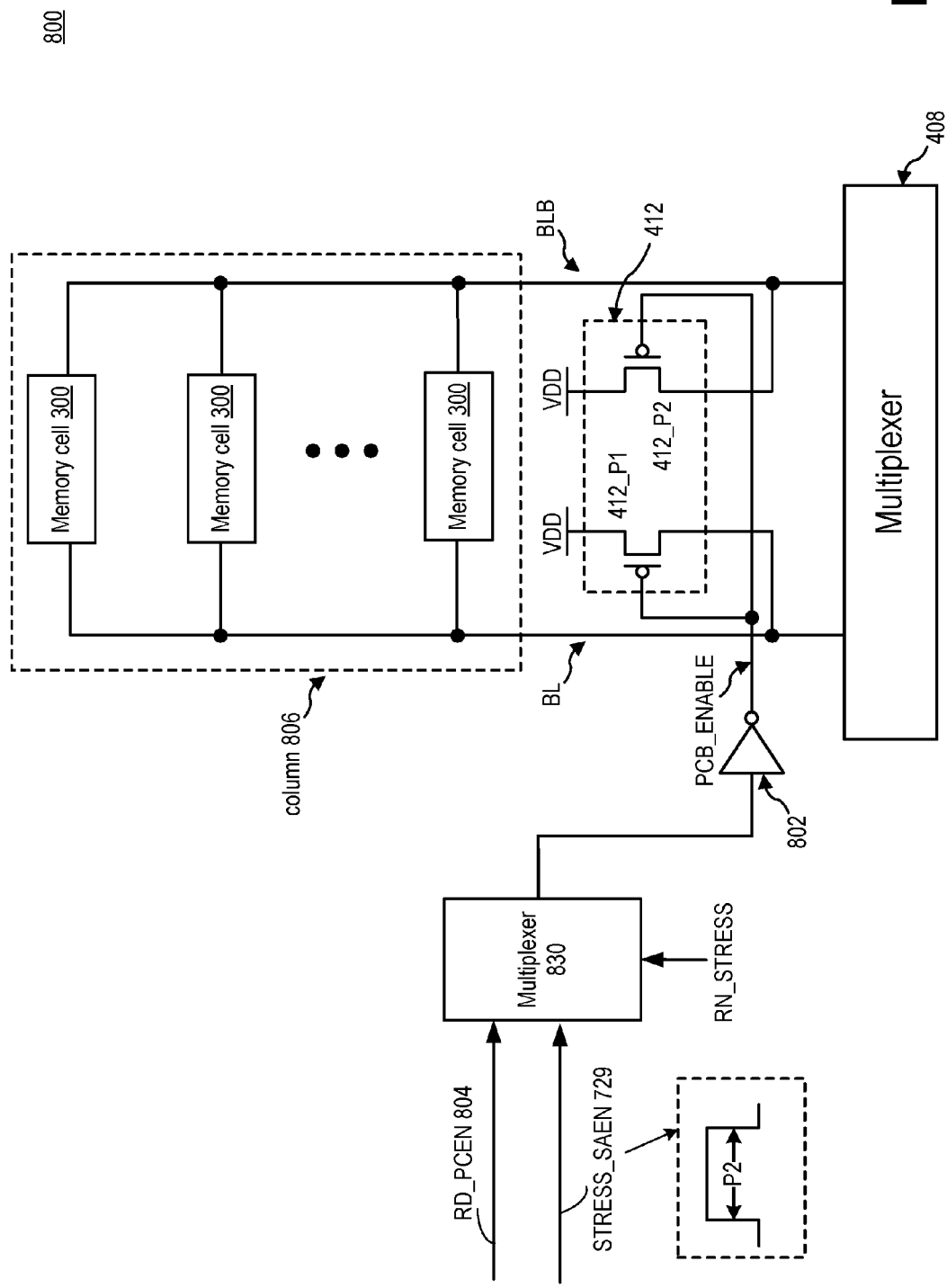
FIG. 8 is a circuit diagram of an exemplary embodiment of circuits to pull up the bitlines in the second operation.

FIG. 8 is a circuit diagram 800 of an exemplary embodiment of circuits to pull up the bitlines in the second operation, such as the random noise stress mode. The circuit diagram 800 includes a column 806 of memory cells 300. The memory cells 300 are coupled to the bitline pair BL and BLB. The bitline pair BL and BLB is provided to the multiplexer 408 (e.g., as BL_RD and BLB_RD) as described with FIG. 4.

The BLPC circuit 412 functions as the precharge circuit for the read operation by pulling up the bitline pair BL and BLB to a predetermined level. The BLPC circuit 412 may also operate as the pull-up circuit for the random noise stress mode by pulling up the bitline pair BL and BLB to a prearranged level. The circuit diagram 800 thus shows that the predetermined level for the read operation and the prearranged level for the random noise stress mode are both high level or VDD. In some examples, the predetermined level for the read operation and the prearranged level for the random noise stress mode need not be the same. Moreover, the precharge circuit for the read operation and the pull-up circuit for the random noise stress mode need not to be the same circuit.

The BLPC circuit 412 includes a p-type transistor 412_P1 and a p-type transistor 412_P2. The p-type transistor 412_P1 is coupled to the voltage supply VDD and the bitline BL and is enabled by PCB_ENABLE signal (the PCB_ENABLE signal is at low level when asserted). When enabled, the p-type transistor 412_P1 pulls the bitline BL up to VDD. The p-type transistor 412_P2 is coupled to the voltage supply VDD and the bitline BLB and is enabled by PCB_ENABLE signal. When enabled, the p-type transistor 412_P2 pulls the bitline BLB up to VDD.

The precharge enable signal PCB_ENABLE is generated by the multiplexer 830 and the inverter 802. The multiplexer 830 selects between the read precharge signal RD_PCEN 804 and the signal STRESS_SAEN 729, based on the RN_STRESS signal (indicating whether the SRAM 400 is in a random noise stress mode). When the SRAM 400 is in a read operation, the RN_STRESS signal is de-asserted, and the read precharge signal RD_PCEN 804 is selected by the multiplexer 830 to generate the precharge enable signal PCB_ENABLE. In other words, in a read operation, the read precharge signal RD_PCEN 804 controls the turning on and off of the BLPC circuit 412. For example, prior to the read operation, the read precharge signal RD_PCEN 804 may enable the BLPC circuit 412 to pull up the bitline pair BL and BLB. In the read operation, the read precharge signal RD_PCEN 804 may disable the BLPC circuit 412 to end the pulling up of the bitline pair BL and BLB before the wordline WL is asserted. Thus, the read operation is not interfered with due to the BLPC circuit 412 pulling up the bitline pair BL and BLB.

In the second, non-read operation (e.g., the random noise stress mode), the control circuit 720 may control the BLPC circuit 412 to pull up each of the bitline pair BL and BLB. In some examples, the control circuit 720 may control the BLPC circuit 412 by decoupling the read precharge signal RD_PCEN 804 from the BLPC circuit 412 via the multiplexer 830. In the random noise stress mode, the RN_STRESS signal is asserted, and the signal STRESS_SAEN 729 is selected by the multiplexer 830 to generate the precharge enable signal PCB_ENABLE. In other words, in the random noise stress mode, the signal STRESS_SAEN 729 controls at least the turning on of the BLPC circuit 412 to pull up the bitline pair BL and BLB to VDD (while the SAs 420 are enabled by the signal STRESS_SAEN 729).

Referring to FIG. 4, the bitline pair BL_RD and BLB_RD may be controlled in similar fashion as described above. These features are thus omitted for clarity.

As presented above, FIG. 8 provides structures to perform operations shown in flowcharts 500 and 600 (FIGS. 5 and 6). For example, FIG. 8 includes structures to precharge at least one bitline (e.g., BL or BLB) for the read operation (e.g., operation in 504), and to pull up at the least one bitline (e.g., BL or BLB) while the SA 420 is enabled in the second operation (e.g., operation in 608), to decouple a read precharge signal (e.g., RD_PCEN 804) from the BLPC circuit 412 (e.g., operation in 610), and to pull up each of the pair of differential bitlines (e.g., BL and BLB) while the SA 420 is enabled for the second operation (e.g., operation in 618).

Figure 9:
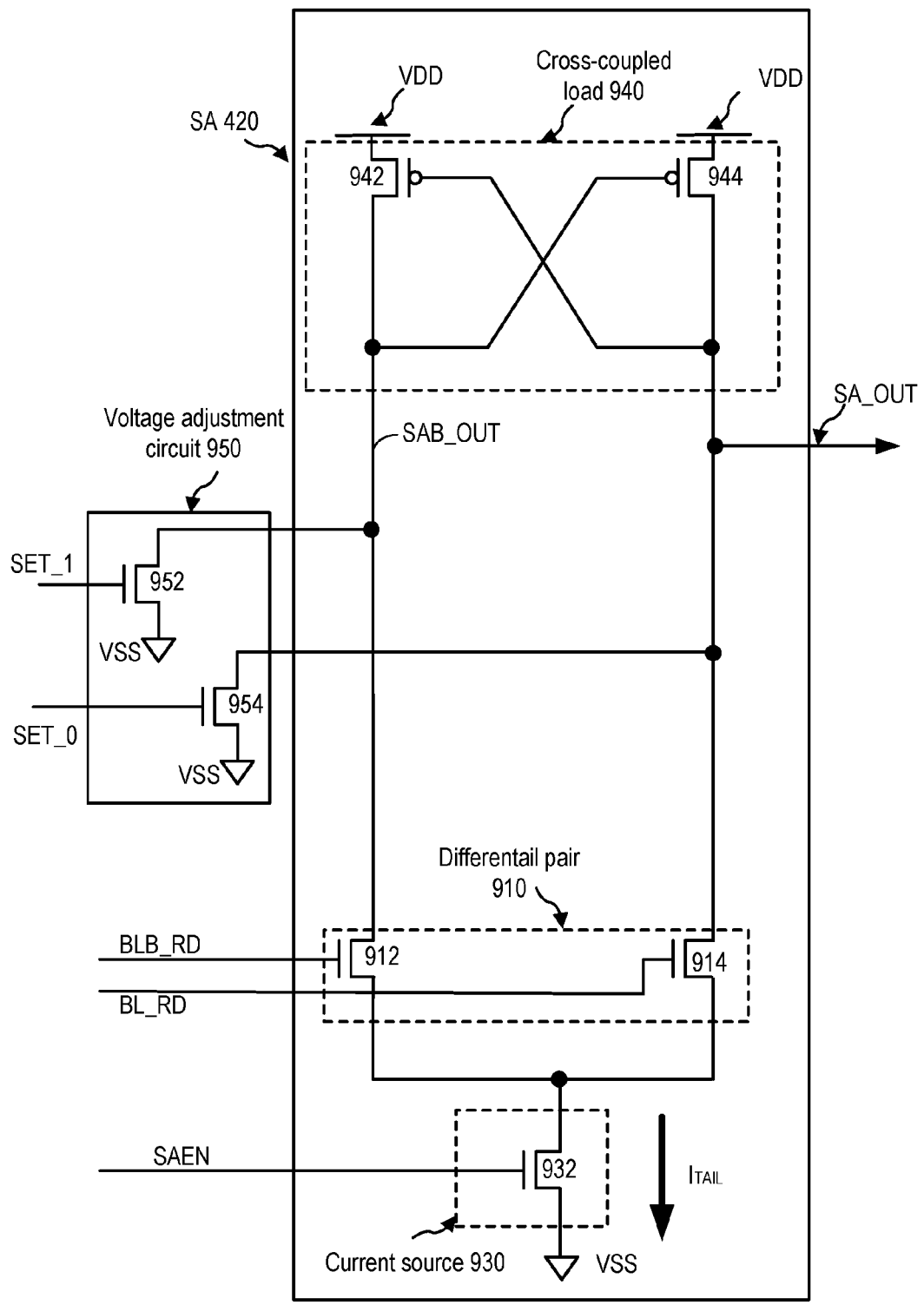
FIG. 9 is a circuit diagram of an exemplary embodiment of a sense amplifier and a voltage adjustment circuit setting the sense amplifier to a predetermined state.

FIG. 9 is a circuit diagram 900 of an exemplary embodiment of a sense amplifier and a voltage adjustment circuit setting the sense amplifier to a predetermined state. The SA 420 includes a differential pair of transistors 910 receiving the bitline pair BL_RD and BLB_RD (see FIG. 4) and outputting the amplified input differential as differential outputs at nodes SAB_OUT and SA_OUT. The SA 420 further includes a current source 930 and a cross coupled load 940.

The differential pair of transistors 910, in some examples, may include n-channel transistors 912 and 914 arranged as a differential pair. The gate of the n-channel transistor 912 receives the BLB_RD as an input, and the gate of the n-channel transistor 914 receives the BL_RD as an input. The differential pair of transistors 910 is further coupled to the current source 930 and to the cross-coupled load 940 (via the nodes SAB_OUT and SA_OUT).

The current source 930 provides a tail current $I_{TAIL}$ that flows through the differential pair of transistors 910. The current source 930 may include an n-channel transistor 932 coupled to ground and to the differential pair of transistors 910. The gate of the n-channel transistor 932 may receive the sense enable signal SAEN to generate the desired tail current $I_{TAIL}$. Referring to FIG. 7, the control circuit 720 of the random noise stress mode asserts the SAEN signal to activate the SA 420 and to amplify the received differential input.

The cross-coupled load 940 couples to the supply voltage VDD and the differential pair of transistors 910 (via the nodes SA_OUT and SAB_OUT). The cross-coupled load 940 may include cross-coupled p-channel transistors 942 and 944. The gate of the p-channel transistor 942 may be coupled to the drain of the p-channel transistor 944 and the node SA_OUT. The gate of the p-channel transistor 944 may be coupled to the drain of the p-channel transistor 942 and the node SAB_OUT. The output of the SA 420 (e.g., to the peripheral circuit 206 or the tester 208) may be the node SA_OUT.

The SA 420 may include other circuits not shown for clarity. For example, the SA 420 may include a SA precharge circuit (not shown) that precharges the nodes SA_OUT and SAB_OUT to a high level (e.g., VDD). The SA precharge circuit may operate at an opposite phase as the current source 930. For example, as the signal SAEN turns on the current source 930, the SA precharge circuit may be turned OFF to allow the SA 420 to amplify the received differential input.

The SA 420 may further include a weak pull-up circuit (not shown) coupled to the nodes SA_OUT and SAB_OUT. In some examples, the pull-up circuit may be weak and constantly on to minimize jitter on the nodes SA_OUT and SAB_OUT arising from, for example, noise coupling. The pull-up circuit may be very weak (e.g., long channel transistors) so as not to interfere with the sensing performed by the SA 420.

The circuit diagram 900 further includes the voltage adjustment circuit 950 configured to set the SA 420 to a predetermined, known state for the random noise stress mode. In some examples, the tester 208 may use this predetermined, known state to determine whether a random noise failure occurred during the enabling of the SA 420 (e.g., the SA 420 changes states) in the random noise stress mode. It is noted that the SA 420 and the corresponding memory cell or cells 300 are not accessed (e.g., not read from or written to) in the random noise stress mode, therefore, the state of the SA 420 should remain the same if no random noise failure occurred.

The voltage adjustment circuit 950 is controlled by the control signals SET_0 and SET_1. The control circuit 720 of the random noise stress mode (e.g., the SA setting component 722) may generate the control signals SET_0 and SET_1. When the control circuit 720 of the random noise stress mode asserts the control signal SET_0, the SA 420 is set to a state where the output SA_OUT is logic 0. When the control circuit 720 of the random noise stress mode asserts the control signal SET_1, the SA 420 is set to a state where the output SA_OUT is logic 1.

The voltage adjustment circuit 950 includes n-type transistors 952 and 954. The n-type transistor 952 is coupled to the node SAB_OUT and ground (VSS). The gate of the n-type transistor 952 is coupled to the control signal SET_1. When the control signal SET_1 is asserted, the n-type transistor 952 pulls the node SAB_OUT to ground and turns on the p-type transistor 944 of the cross-coupled load 940. The p-type transistor 944 pulls the node SA_OUT high (logic 1) and turns off the p-type transistor 942 to maintain the low at the node SAB_OUT.

The n-type transistor 954 is coupled to the node SA_OUT and ground (VSS). The gate of the n-type transistor 954 is coupled to the control signal SET_0. When the control signal SET_0 is asserted, the n-type transistor 954 pulls the node SA_OUT to ground (logic 0) and turns on the p-type transistor 942 of the cross-coupled load 940. The p-type transistor 942 pulls the node SAB_OUT high and turns off the p-type transistor 944 to maintain the logic 0 at the output SA_OUT.

As presented above, FIG. 9 provides structures to perform operations shown in the flowchart 600 (FIG. 6). For example, FIG. 9 includes structures to set the SA 420 to a predetermined state during the enabling of the sense amplifier for the second operation (e.g., random noise stress mode)(e.g., operation in 604).

Figure 10:
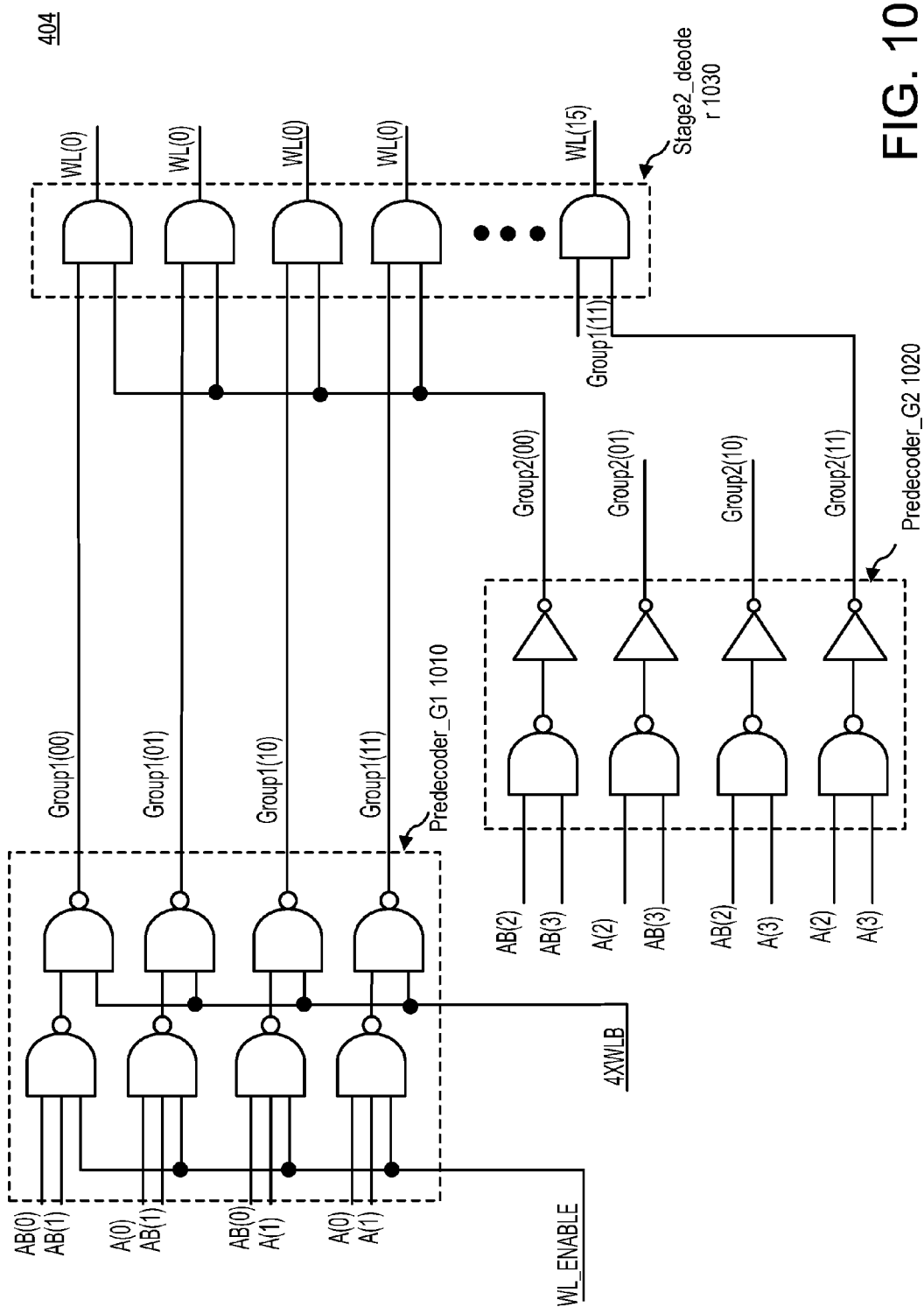
FIG. 10 is a block diagram of an exemplary embodiment of a row decoder configured to assert multiple wordlines.

FIG. 10 is a block diagram of an exemplary embodiment of a row decoder configured to assert multiple wordlines. As an example, the row decoder 404 receives 4-bit address A(0)-A(3) (and their inverse, AB(0)-AB(3)) and asserts at least one wordline among wordlines WL(0)-WL(15). The row decoder 404 may receive the WL_ENABLE signal. When the WL_ENABLE signal is asserted (e.g., at high level), the row decoder 404 asserts at least one of the wordlines WL(0)-WL(15). When the WL_ENABLE signal is de-asserted (e.g., at low level), the row decoder 404 de-asserts all of the wordlines WL(0)-WL(15). The generation of the WL_ENABLE signal is presented in FIG. 11.

The row decoder 404 may further receive the 4XWLB control signal which controls how many wordlines are asserted. Referring to FIG. 7, the control circuit 720 of the random noise stress mode may include the 4XWL generation component 724 outputting the 4XWLB control signal. When the 4XWLB control signal is asserted (e.g., at low level), the row decoder 404 asserts four wordlines at once. When the 4XWLB control signal is de-asserted (e.g., at high level), the row decoder 404 asserts a single wordline at one time.

In some examples, the row decoder 404 may be a two-stage decoder. A first stage includes two predecoding groups: predecoder_G1 1010 and predecoder_G2 1020. The second stage includes stage2_decoder 1030. The logic gates shown in the predecoder_G1 1010, the predecoder_G2 1020, and the stage2_decoder 1030 illustrate functionalities and not necessary the actual implementations.

The predecoder_G1 1010 receives the address A(0) and A(1) (and their inverse AB(0) and AB(1)), and outputs decoded signals group1(00), group1(01), group1(10), and group1(11). When the 4XWLB control signal is de-asserted, one of the decoded signals group1(00)-group1(11) is asserted (e.g., logic 1) by the predecoder_G1 1010. The predecoder_G2 1020 receives the address A(2) and A(3) (and their inverse AB(2) and AB(3)), and output decoded signals group2(00), group2(01), group2(10), and group2(11). One of the decoded signals group2(00)-group2(11) is asserted by the predecoder_G2 1020.

The stage2_decoder 1030 outputs 16 wordlines, each is based on one of the decoded signals group1(00)-group1(11) and one of the decoded signals group2(00)-group2(11). When the 4XWLB control signal is de-asserted, only one of the decoded signals group1(00)-group1(11) and one of the decoded signals group2(00)-group2(11) are asserted, and therefore, only one of the 16 wordlines is asserted. When the 4XWLB control signal is asserted, the predecoder_G1 1010 asserts all of the decoded signals group1(00)-group1(11). Thus, four of the 16 wordlines are asserted accordingly. In this fashion, the control circuit 720 of the random noise stress mode (e.g., the 4XWL generation component 724) may effect the assertion of multiple wordlines while the SA 420 is enabled in the random noise stress mode.

As presented above, FIG. 10 provides structures that perform various operations of flowchart 600 (FIG. 6). For example, FIG. 10 includes structures to assert the wordline for the second operation (e.g., operation in 614), and to assert multiple wordlines while the SA 420 is enabled for the second operation (e.g., operation in 616).

Figure 11:
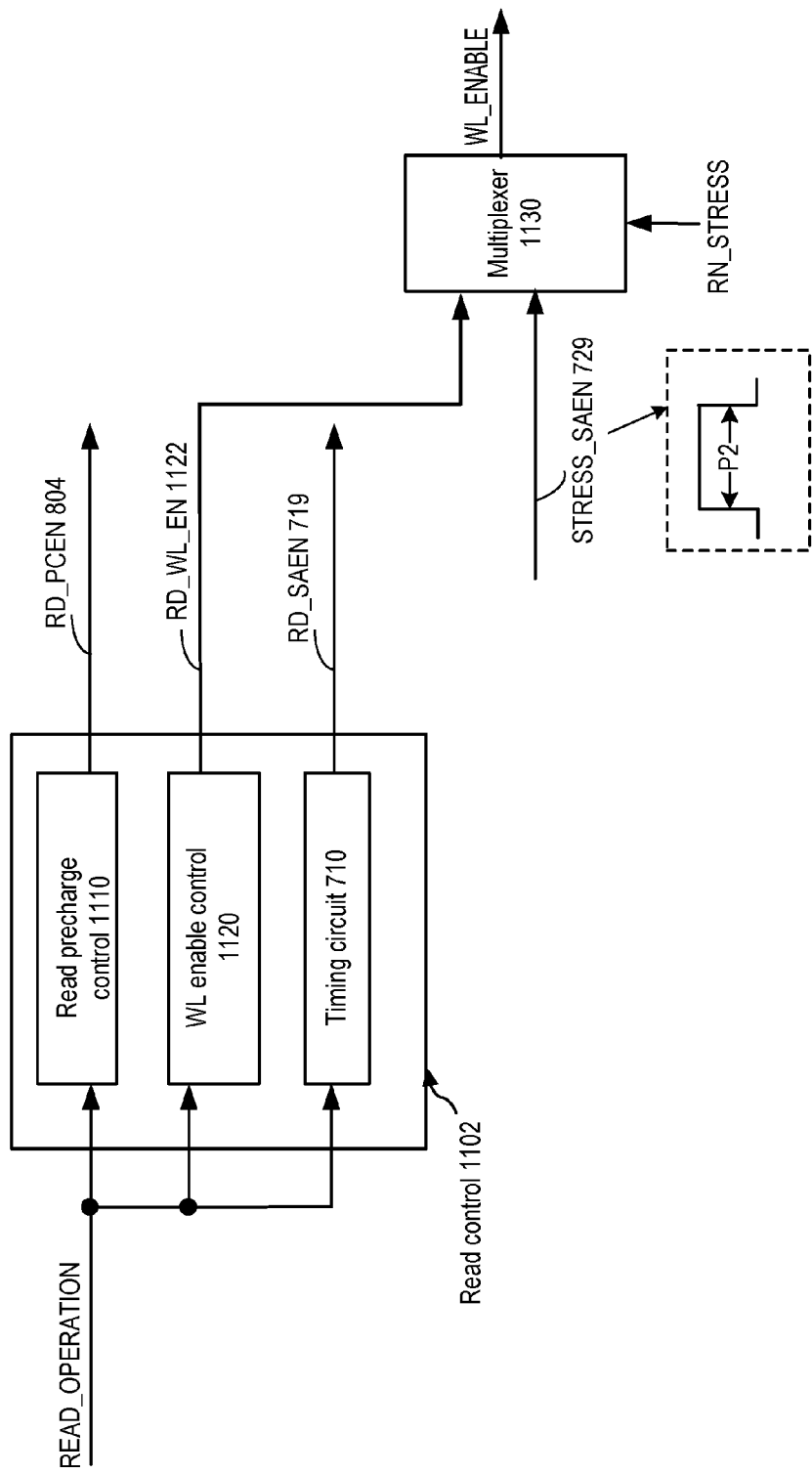
FIG. 11 is a block diagram of a read control block of the SRAM of the FIG. 4 for the read operation.

FIG. 11 is a block diagram 1100 of a read control block of the SRAM of the FIG. 4 for the read operation. The read control block 1102 includes various components for generating the signals used in read operation. In some examples, the READ_OPERATION signal may function as the master clock for the read operation and is based upon an assertion of which signals used in read operation are generated. For example, the read control block 1102 may include the timing circuit 710 (discussed in FIG. 7). The timing circuit 710 receives or couples to the READ_OPERATION signal and generates the read SA enable signal RD_SAEN 719 for the read operation. The read control block 1102 may further include the read precharge control 1110 that receives or couples to the READ_OPERATION signal and generates the read precharge signal RD_PCEN 804. The read precharge signal RD_PCEN 804 controls the BLPC circuit 412 to precharge the bitline pair BL and BLB in the read operation (see FIG. 8).

In some examples, the read control block 1102 may further include WL enable control 1120 that receives or couples to the READ_OPERATION signal and generates the read wordline enable signal RD_WL_EN 1122. The signal RD_WL_EN 1122 enables and controls the timing of the asserted wordline in the read operation. The multiplexer 1130 selects between the read wordline enable signal RD_WL_EN 1122 and the signal STRESS_SAEN 729, based on the RN_STRESS signal (indicating whether the SRAM 400 is in a random noise stress mode). The multiplexer 1130 outputs the selected signal as the WL_ENABLE signal and provides the WL_ENABLE signal to the row decoder 404. When the SRAM 400 is in a read operation, the RN_STRESS signal is de-asserted, and the read wordline enable signal RD_WL_EN 1122 is selected by the multiplexer 1130 to assert the wordline in the read operation (see FIG. 10). In the random noise stress mode, the RN_STRESS signal is asserted, and the signal STRESS_SAEN 729 (having a time period P2) is selected by the multiplexer 1130 to assert the wordline or multiple wordlines. Thus, in the random noise stress mode, the wordlines may be asserted for the same time period P2 as the enabling of the SAs 420.

Figure 12:
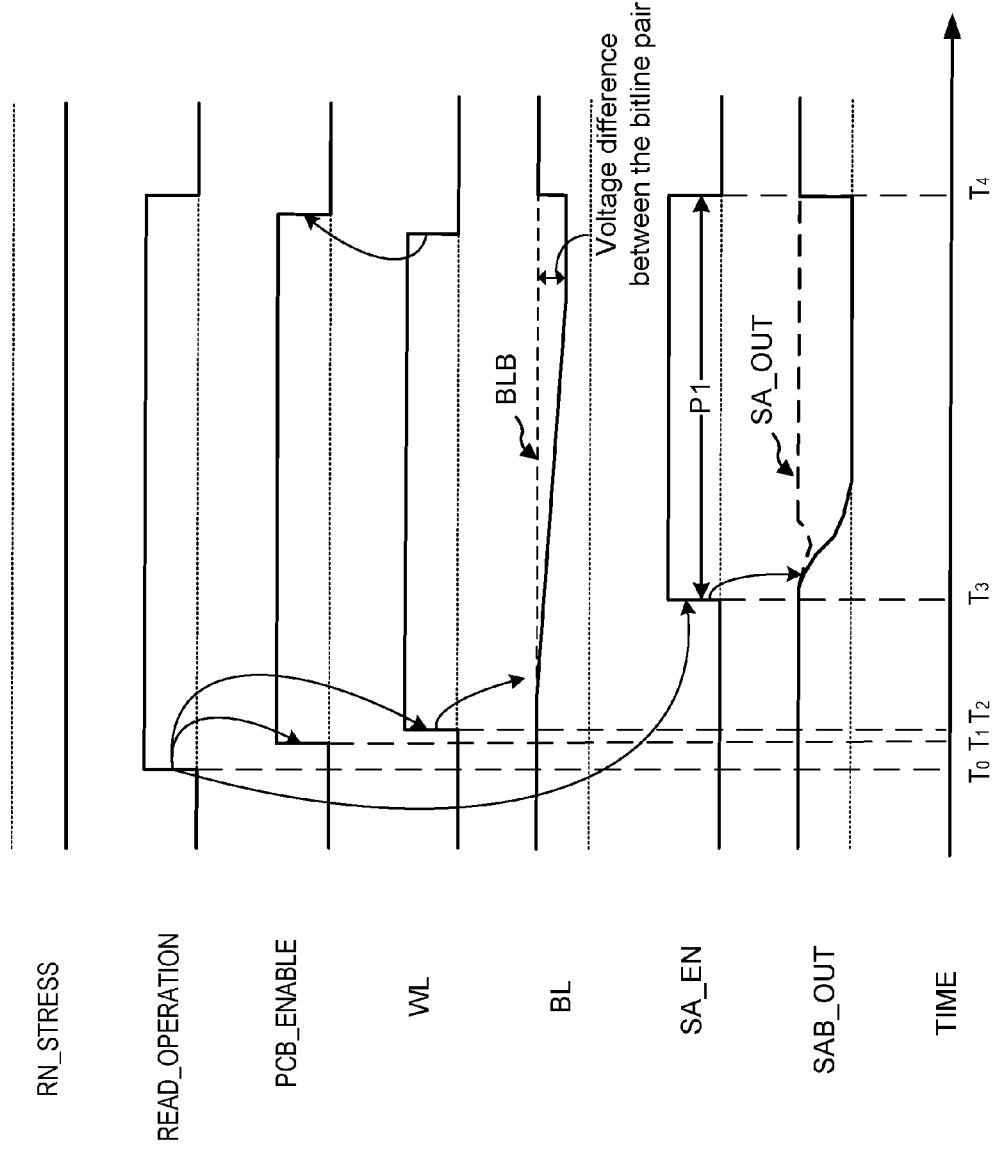
FIG. 12 is a timing diagram of a read operation performed by the SRAM of FIG. 4.

FIG. 12 is a timing diagram 1200 of a read operation performed by the SRAM of FIG. 4. The timing diagram 1200 depicts various signals in the read operation as operated by the circuits of FIGS. 7-11. By way of example, the memory cell 300 stores a logic 1 at the output of the inverter 302, and stores a logic 0 at the output of the inverter 304. In the read operation, the RN_STRESS signal remains de-asserted (e.g., at low level).

At $T_0$, the READ_OPERATION signal is asserted, indicate that the SRAM 400 is in the read operation. In some examples, the READ_OPERATION signal may function as the master clock for the read operation, and the assertion thereof triggers various actions in the read operation as described below.

At $T_1$, the PCB_ENABLE signal is de-asserted (e.g., pulled to high level) in response to the assertion of the READ_OPERATION signal. Prior to $T_1$, the PCB_ENABLE signal is asserted to cause the BLPC circuit 412 precharge or pull up the bitline pair BL and BLB to the predetermined level (e.g., high level). The read precharge control 1110 generates the read precharge signal RD_PCEN 804 in response to the READ_OPERATION signal being asserted. The read precharge signal RD_PCEN 804 generates the PCB_ENABLE signal that controls the BLPC circuit 412 to precharge the bitline pair BL and BLB to high level in the read operation (see FIG. 8).

At $T_2$, the wordline WL is asserted in response to the assertion of the READ_OPERATION signal. The WL enable control 1120 receives the READ_OPERATION signal and generates the read wordline enable signal RD_WL_EN 1122. The multiplexer 1130 selects the signal RD_WL_EN 1122 and outputs the selected signal as the signal WL_ENABLE. The row decoder 404 receives the WL_ENABLE signal and, in response, asserts one of the wordlines for the read operation.

The asserted wordline connects the bitline pair BL and BLB to the memory cell 300. Specifically, the bitline BL is connected to the output of the inverter 302 through the access transistor 314, and the bitline BLB is connected to the output of the inverter 304 through the access transistor 318. The bitline BL, which was precharged before the read operation, begins discharging through the n-channel transistor 308 in the inverter 302 toward VSS (i.e., a logic level 0). The bitline BLB remains charged (i.e., logic 1). See the description provided with FIG. 3. As a result, a voltage difference is developed between the bitline BL and the bitline BLB (and between the bitline BL_RD and the bitline BLB_RD, which are inputs of the SA 420).

At $T_3$ to $T_4$, the SAEN signal is asserted in response to the assertion of the READ_OPERATION signal to enable the SA 420. The time period between $T_3$ and $T_4$ corresponds to the time period P1. See, for example, FIG. 7 and the corresponding descriptions. In response to the assertion of the SAEN signal, the SA 420 amplifies the voltage difference between the bitline BL and the bitline BLB (e.g., between the bitline BL_RD and the bitline BLB_RD, which are inputs of the SA 420) and outputs the result as the SA_OUT.

FIG. 13 is a timing diagram 1300 of a second operation performed by the SRAM of FIG. 4. The timing diagram 1300 depicts various signals in second operation (e.g., a test operation such as the random noise stress mode) as operated by the circuits of FIGS. 7-11. In the second, non-read operation, the READ_OPERATION signal remains de-asserted (e.g., at low level) and is not shown for clarity.

At $T_5$, the RN_STRESS signal is asserted, indicating that the SRAM 400 is in the second, non-read operation such as the random noise stress mode. The RN_STRESS signal may be received from the operation control 102, which may be provided by the tester 208.

AT $T_6$, the PCB_ENABLE signal is de-asserted (e.g., pulled to a high level) in response to the RN_STRESS signal being asserted. Referring to FIGS. 7 and 8, the multiplexer 830 selects the signal STRESS_SAEN 729 (which is based on the STRESS_CTL signal) based on the asserted RN_STRESS signal. At $T_6$, the STRESS_CTL signal is de-asserted, and therefore, the PCB_ENABLE signal is de-asserted. Thus, at $T_6$, the BLPC is disabled by the PCB_ENABLE signal and does not pull up the bitline pair BL and BLB.

Further, at $T_6$, the SET_1 signal may be asserted to set the SA 420 to a known state. Referring to FIG. 7, the SA setting component 722 may, based on the RN_STRESS signal and the STRESS_CTL signal, assert the SET_1 signal (pulled to a high level). The assertion of the SET_1 signal sets the SA 420 of a known state (e.g., SA_OUT being at logic 1 and SAB_OUT being at logic 0). The assertion of the SET_0 signal may be similarly controlled and is omitted for clarity.

At $T_8$-$T_9$, the STRESS_CTL signal is received, for example, from the operation control 102. The STRESS_

CTL signal may be based on a signal external to the SRAM 400. For example, the STRESS_CTL signal may correspond to an external signal inputted by the tester 208 and have an asserted time period P2 ($T_8$-$T_9$).

Further, at $T_8$-$T_9$, the PCB_ENABLE signal may be asserted for the time period P2 (as controlled by the STRESS_CTL signal)(see, FIG. 8). The PCB_ENABLE signal thus controls the BLPC circuit 412 to pull up the bitline pair BL and BLB for the time period P2.

Further, at $T_8$-$T_9$, the wordline may be asserted for the time period P2 (as controlled by the STRESS_CTL signal) (see, FIG. 10). In this fashion, the memory cells 300 coupled to the asserted wordline is stressed at the same time period P2.

Further, at $T_8$-$T_9$, the SAEN may be asserted for the time period P2 (as controlled by the STRESS_CTL signal)(see, FIGS. 7 and 9). In this fashion, the SA 420 is enabled by the SAEN signal and is stressed for the time period P2.

The specific order or hierarchy of blocks in the method of operation described above is provided merely as an example. Based upon design preferences, the specific order or hierarchy of blocks in the method of operation may be re-arranged, amended, and/or modified. The accompanying method claims include various limitations related to a method of operation, but the recited limitations are not meant to be limited in any way by the specific order or hierarchy unless expressly stated in the claims.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. A memory, comprising:
a memory cell;
at least one bitline coupled to the memory cell;
a sense amplifier coupled to the at least one bitline;
a timing circuit configured to enable the sense amplifier during a read operation;
a control circuit configured to enable the sense amplifier independent of the timing circuit for an extended time period longer than a period for the read operation and determine whether the sense amplifier changes states during the extended enabling period; and
a pull-up circuit configured to pull up the at least one bitline while the sense amplifier is enabled by the control circuit.

2. The memory of claim 1, wherein the extended time period is based on a signal external to the memory.

3. The memory of claim 1, further comprising a dummy bitline circuit configured to match an electrical characteristic of the at least one bitline, wherein the timing circuit is further configured to enable the sense amplifier in response to the dummy bitline circuit.

4. The memory of claim 1, wherein the pull-up circuit comprises a precharge circuit configured to precharge the at least one bitline for the read operation.

5. The memory of claim 4, wherein the control circuit is further configured to decouple a read precharge signal from the precharge circuit to enable the pull-up circuit to pull up the at least one bitline while the sense amplifier is enabled by the control circuit.

6. The memory of claim 1, further comprising
a wordline coupled to the memory cell; and
an address decoder configured to assert the wordline for the read operation while the sense amplifier is enabled by the control circuit.

7. The memory of claim 6, further comprising
a plurality of memory cells comprising the memory cell; and
a plurality of wordlines comprising the wordline respectively coupled to the plurality of memory cells,
wherein the address decoder is further configured to assert the plurality of wordlines while the sense amplifier is enabled by the control circuit.

8. The memory of claim 1, further comprising a voltage adjustment circuit configured to set the sense amplifier to a predetermined state during the enabling of the sense amplifier.

9. The memory of claim 1, wherein the control circuit is further configured to detect a sense amplifier failure that occurred while the sense amplifier is enabled by the control circuit.

10. The memory of claim 1, wherein the at least one bitline comprises a pair of differential bitlines, and the pull-up circuit is configured to pull up each of the pair of differential bitlines while the sense amplifier is enabled by the control circuit.

11. A method for operating a memory, comprising:
enabling a sense amplifier in a read operation by a timing circuit, the sense amplifier being coupled to at least one bitline, and the at least one bitline being coupled to a memory cell;
enabling the sense amplifier for an extended time period longer than a period for the read operation independent of the timing circuit in a second operation;
pulling up the at least one bitline by a pull-up circuit while the sense amplifier is enabled in the second operation; and
determining whether the sense amplifier changes states during the extended enabling period.

12. The method of claim 11, wherein the extended time period is based on a signal external to the memory.

13. The method of claim 11, wherein the timing circuit comprises a dummy bitline circuit configured to match an electrical characteristic of the at least one bitline.

14. The method of claim 11, further comprising precharging the at least one bitline for the read operation by the pull-up circuit.

15. The method of claim 14, wherein the pulling up the at least one bitline by the pull-up circuit while the sense amplifier is enabled in the second operation comprises decoupling a read precharge signal from the pull-up circuit.

16. The method of claim 11, further comprising asserting a wordline coupled to the memory cell for the read operation and for the second operation.

17. The method of claim 16, further comprising asserting a plurality of wordlines, comprising the wordline, respectively coupled to a plurality of memory cells, comprising the memory cell, while the sense amplifier is enabled for the second operation.

18. The method of claim 11, further comprising setting the sense amplifier to a predetermined state during the enabling of the sense amplifier for the second operation.

19. The method of claim 11, further comprising detecting a sense amplifier failure that occurred while the sense amplifier is enabled for the second operation.

20. The method of claim 11, wherein the at least one bitline comprises a pair of differential bitlines;
further comprising pulling up each of the pair of differential bitlines while the sense amplifier is enabled for the second operation.

21. A memory, comprising:
a plurality of memory cells;
a plurality of wordlines respectively coupled to the plurality of memory cells;
at least one bitline coupled to one memory cell of the plurality of memory cells;
a sense amplifier coupled to the at least one bitline;
a control circuit configured to enable the sense amplifier for an extended time period longer than a period for a read operation and determine whether the sense amplifier changes states during the extended enabling period; and
an address decoder configured to assert the plurality of wordlines while the sense amplifier is enabled by the control circuit.

22. The memory of claim 21, further comprising a pull-up circuit configured to pull up the at least one bitline while the sense amplifier is enabled by the control circuit.

23. The memory of claim 22, wherein the at least one bitline comprises a pair of differential bitlines, and the pull-up circuit is configured to pull up each of the pair of differential bitlines while the sense amplifier is enabled by the control circuit.

24. The memory of claim 21, wherein the extended time period is based on a signal external to the memory.

25. The memory of claim 21, wherein the control circuit is further configured to enable the sense amplifier in a non-read operation.

26. The memory of claim 25, further comprising a timing circuit configured to enable the sense amplifier during a read operation, wherein the control circuit is configured to enable the sense amplifier independent of the timing circuit.

27. The memory of claim 25, further comprising a pull-up circuit configured to pull up the at least one bitline while the sense amplifier is enabled by the control circuit in the non-read operation and configured to precharge the at least one bitline for a read operation.

28. The memory of claim 27, wherein the control circuit is further configured to decouple a read precharge signal from the pull-up circuit while the sense amplifier is enabled by the control circuit in the non-read operation.

29. The memory of claim 21, wherein the control circuit is further configured to detect a sense amplifier failure that occurred while the sense amplifier is enabled by the control circuit.

30. An apparatus, comprising:
a plurality of memory cells;
a plurality of wordlines respectively coupled to the plurality of memory cells;
at least one bitline coupled to one memory cell of the plurality of memory cells;
sense amplifying means for sensing data on the at least one bitline;
timing means for enabling the sense amplifier means during a read operation;
control means for enabling the sense amplifying means independent of the timing circuit means for an extended time period longer than a period for the read operation and determine whether the sense amplifier changes states during the extended enabling period; and
address decoding means for asserting the plurality of wordlines.

* * * * *